United States Patent [19]

Kroger et al.

[11] Patent Number: 5,024,993
[45] Date of Patent: Jun. 18, 1991

[54] SUPERCONDUCTING-SEMICONDUCTING CIRCUITS, DEVICES AND SYSTEMS

[75] Inventors: Harry Kroger; Uttam S. Ghoshal, both of Austin

[73] Assignee: Microelectronics & Computer Technology Corporation, Austin, Tex.

[21] Appl. No.: 518,004

[22] Filed: May 2, 1990

[51] Int. Cl.[5] .................... H01L 27/00; H01L 39/00; G06F 7/00; H05G 1/66
[52] U.S. Cl. .................................. 505/1; 357/5; 357/41; 357/45; 357/4; 364/715.08; 377/70; 377/93; 505/701
[58] Field of Search ................ 357/4, 5, 41, 45; 364/715.8; 377/70, 74, 79, 81, 93; 505/1

[56] References Cited

U.S. PATENT DOCUMENTS 4,780,750 10/1988 Nolan et al. ...................... 357/41
4,845,539 7/1989 Inoue ................................ 357/41
4,888,629 12/1989 Harada et al. ................... 357/5
4,891,682 1/1990 Yusa et al. ........................ 357/45

FOREIGN PATENT DOCUMENTS 6301085 1/1988 Japan ................................ 357/5

OTHER PUBLICATIONS

"Introduction to VLSI Systems", Mead et al, Addison-Wesley Co., 1980, pp. 76-79.
Kleinsasser et al, "Prospects for Proximity Effect Superconducting FETs," IEEE Transactions on Magnets, vol. 25, No. 2, 1989, pp. 1274-1277.
Kroger et al., "Superconductor-Semiconductor Hybrid Devices, Circuits and Systems," Proceedings of the IEEE, vol. 77, No. 8, Aug., 1989, pp. 1287-1301.
Shannon, "A Symbolic Analysis of Relay and Switching Circuits," AIEE Transactions, vol. 57, 1938, pp. 713-723.
Caldwell, "Switching Circuits and Logical Design," New York: Wiley 1958.
Kohavi, "Switching and Finite Automata," New York: McGraw-Hill 1970.

Primary Examiner—Rolf Hille
Assistant Examiner—Mahshid Saadat
Attorney, Agent, or Firm—Fulbright & Jaworski

[57] ABSTRACT

A hybrid superconducting-semiconducting field effect transistor-like circuit element comprised of a superconducting field effect transistor and a closely associated cryogenic semiconductor inverter for providing signal gain is described. The hybrid circuit functions as a nearly ideal pass gate in cryogenic applications.

20 Claims, 3 Drawing Sheets

I-V characteristics of a superconducting FET

SFET Inverters

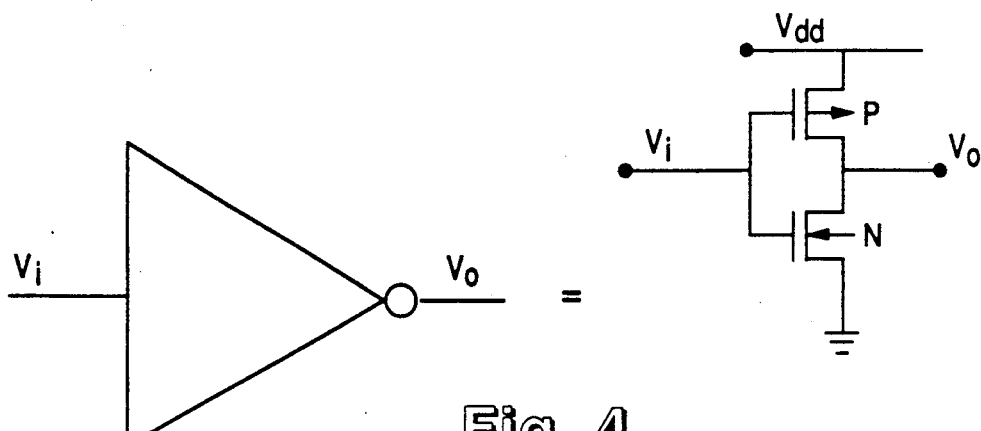
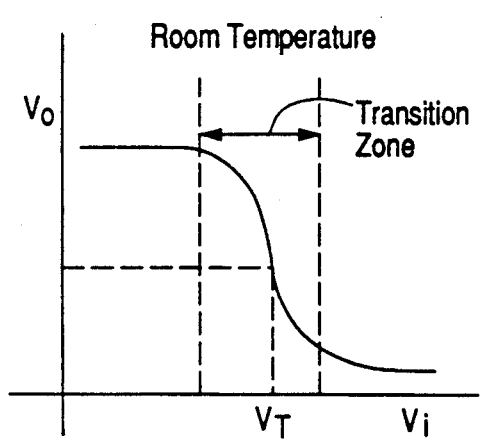
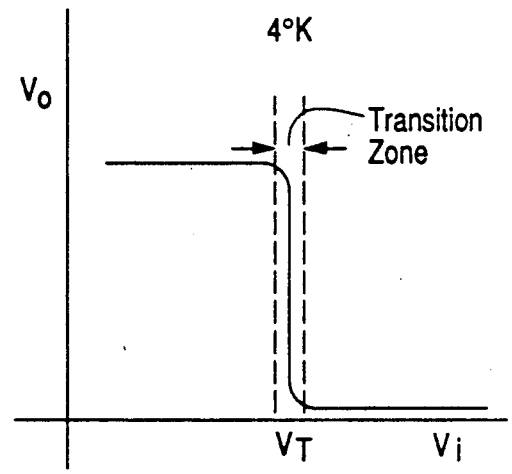
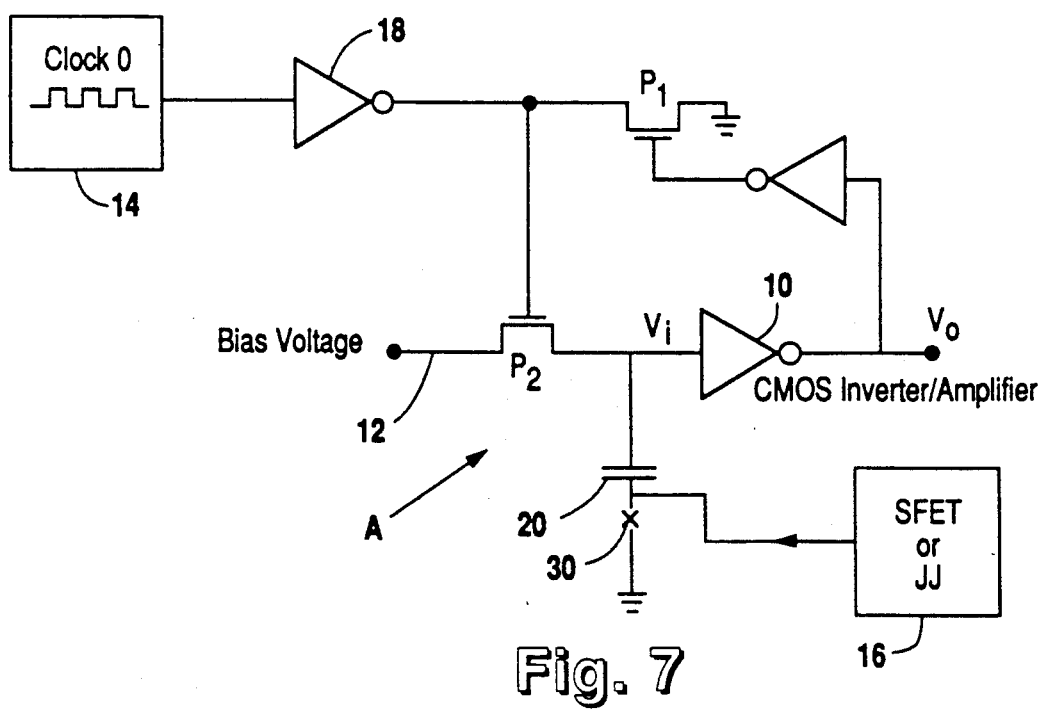

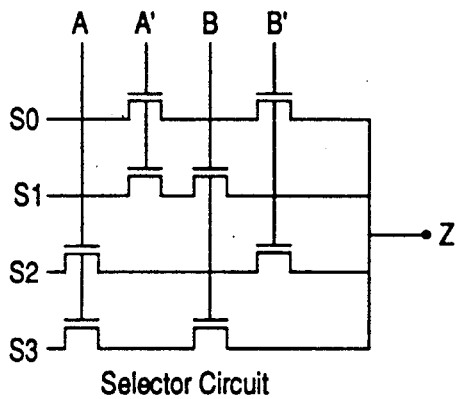
Fig. 8 Selector Circuit
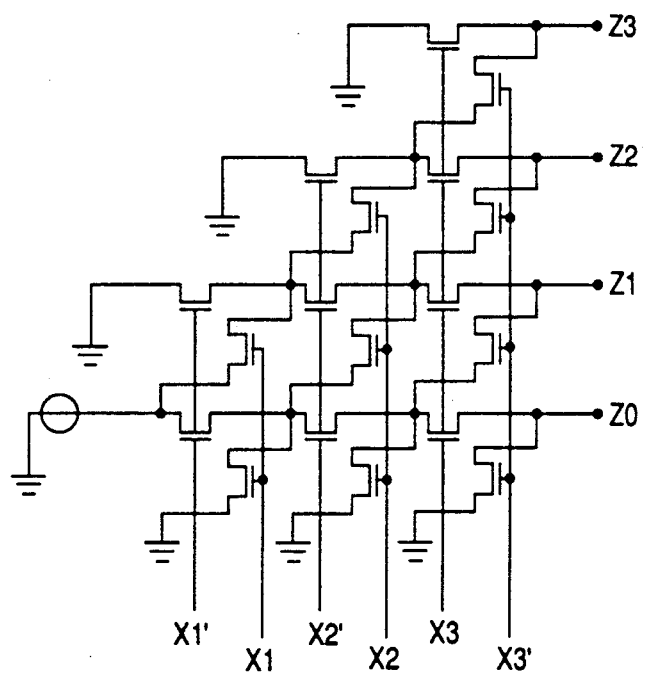
Fig. 9 Tally Circuit
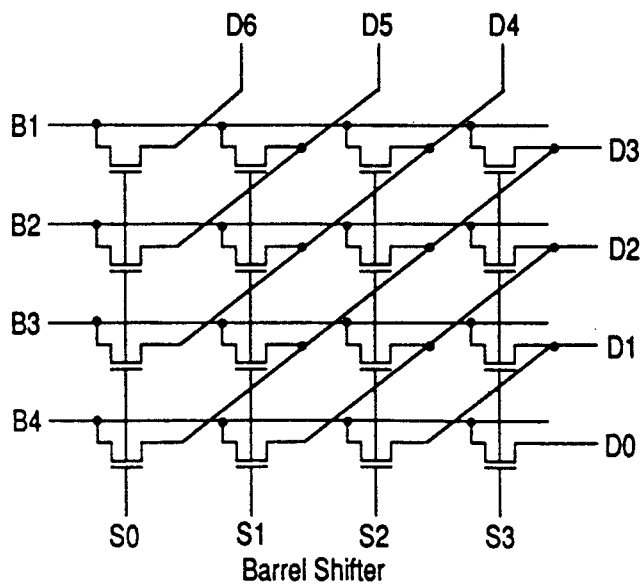
Fig. 10 Barrel Shifter

SUPERCONDUCTING-SEMICONDUCTING CIRCUITS, DEVICES AND SYSTEMS

U.S. GOVERNMENT LICENSE RIGHTS

The U.S. Government has a paid-up license in this invention in the right in limited circumstances to require the patent owner to license others on reasonable terms as provided for by the terms of Contract No. N00014-90-C-0219 awarded by the Office of Naval Research.

BACKGROUND OF THE INVENTION

The present invention relates to hybrid circuits and devices fabricated from superconductor materials combined with semiconductor devices that can be operated at low temperatures. More particularly the present invention relates to superconducting field effect transistor-like devices, sometimes called JOFETs for Josephson FETs or SFETs for superconducting FETs, and improvements to the utility of such devices when used in combination with low temperature CMOS devices in applications such as high speed, low power consumption memory and logic circuits. The present invention makes use of superconductive materials with low critical temperatures ($T_c \leq 20$ K.) as well as superconductive materials with high critical temperatures ($T_c > 20$ K.).

2. Description of the Related Art

The discovery of superconductors whose critical temperatures are above liquid nitrogen temperature prompted increased interest in hybrid superconducting-semiconducting electronic circuit applications. The possibilities for using superconducting devices for interconnecting conventional semiconductor circuits and devices have been studied. See for example, "Superconductor-Semiconductor Hybrid Devices, Circuits and Systems," Kroger, et al., Proceedings of the IEEE, Vol. 77, No. 8, Aug. 1989; T. van Duzer, "Superconductor-Semiconductor Hybrid Devices, Circuits and Systems," Cryogenics, Vol. 28, pp. 527-531 (1988); H. Kroger, "Josephson Devices Coupled by Semiconductor Links," IEEE Trans. Electron Devices, Vol. ED-27, pp. 2016-2126 (1980).

Prior art investigation and fabrication of hybrid three-terminal devices has led to the general conclusion that such devices are interesting but essentially useless in an engineering sense. The motivation for developing such devices has been to improve upon the gain and isolation available from conventional Josephson tunnel junctions, as well as to provide an active device which can perform all the conventional circuit functions as transistor circuits.

Superconducting Field Effect Transistors have been fabricated. FIG. 1 illustrates a superconducting FET structure. The superconducting FET is similar to conventional semiconductor FET structure, except that the source and drain must be superconductors. Devices constructed to date have a channel length in the range of 0.1 to 1.0 μm. The function of a superconducting FET is similar to that of a conventional semiconductor FET, but it makes use of a conduction mechanism characteristic of superconductivity known as the proximity effect. Compared to the tunnel junctions thin barrier (10-60 nm) the greater channel length of the superconducting FET implies that the transport mechanism cannot be the tunnel effect. Superconducting electrons can diffuse into a doped semiconductor and make it weakly superconductive. This is called the proximity effect. The doped semiconductor need not be degeneratively doped since an inversion layer can also support a supercurrent and the material in which the inversion layer is formed need not be degeneratively doped.

Superconducting FETs function in analogy to semiconducting FETs in that the gate voltage controls the current flowing from the source to the drain. In superconducting FETs, the magnitude of a zero-voltage current can be controlled by the gate electrode. The drain of the device is either in a voltage state (on the order of tens of millivolts) or exactly at zero voltage. The SFET is unique in that it has a nonzero transconductance when the drain-to-source voltage is zero. No semiconductor FET has this property. One hope for such devices has been that they would provide fast switching with very low power dissipation. No matter which configuration is utilized, a minimum gate voltage is required to turn on or turn off a zero-voltage drain current. The only superconducting FETs studied to date were fabricated from low-temperature superconductors and are considered to be of little practical importance because they have zero power gain and do not produce an output voltage signal large enough to enable an SFET string of logic gates to be operated without additional logic level voltage restoration.

Many weak couplings of two superconductors show the Josephson effect. Such weak couplings include tunneling barriers, geometric constrictions in the superconductors themselves, and films of normal metals thinner than several hundreds of nanometers. These structures are called weak links.

For a normal metal weak link the critical current, $I_c$, is a function of the normal carrier density in the link. $I_c$ is proportional to $\exp(-L/\xi n)$ where L is the length of the link and n is the coherence length in the normal metal. $\xi n$ is given by:

$$\xi n = \hbar^3 \mu / 6\pi m^* ekT)^{\frac{1}{2}} (3\pi^2 n)^{\frac{1}{3}}$$

Where $\hbar$ is the reduced Planck constant, m is the carrier mobility, T is the absolute temperature, $m^*$ is the carrier effective mass, k is Boltzmann's constant, and n is the carrier density in the normal metal. Values of the coherence length in degeneratively doped semiconductors are typically a few hundred nanometers at 4.2 K. and lower temperatures.

A number of proposals have been made to develop superconducting three terminal devices analogous to semiconductor FETs. See for example, A. W. Kleinsasser and T. N. Jackson, "Superconductivity and field effect transistors," in Proc. 18th Int. Conf. on Low Temperature Physics (Kyoto); Jpn.J.Appl.Phys., Vol. 26, pp. 1545-1546, 1987; M. F. Millea, A. H. Silver, and L. D. Flesner, "Superconductivity contact to p-InAs," IEEE Trans. Magn., Vol. MAG-15, pp. 435-438, 1979; A. H. Silver, A. B. Chase, M. McCall, and M. F. Millea, "Superconductor-semiconductor device research," in Future Trends in Superconductive Electronics, B. S. Dever, C. M. Falco, J. H. Harris, and S. A. Wolf, Eds. New York, N.Y.: Am. Inst. of Physics, 1978, pp. 368-379; T. D. Clark, R. J. Prance, and A. D. C. Grassie, "Feasibility of hybrid Josephson field effect transistors," J.Appl.Phys., Vol. 51, pp. 2736-2745, 1980; A. W. Kleinsasser et al., "Semiconductor heterostructure weak links for superconducting FET applications," IEEE Trans. Magn., Vol. MAG-23, pp. 703-706, 1987; Z. Ivanov and T. Claeson, "A three terminal Josephson junction with a semiconducting two-dimensional electron gas layer," IEEE Trans. Magn., Vol. MAG-23, pp. 711–713, 1987; T. Nichino and U. Kawabe, "Realization of semiconductor-coupled superconducting transistor," in Proc. 2nd Int. Symp. Foundations of Quantum Mechanics (Tokyo), pp. 231–240, 1986; T. Nichino, M. Miyake, Y. Harada, and U. Kawabe, "Three-terminal superconducting devices using a Si single-crystal film," IEEE Electron Device Lett., Vol. EDL-6, pp. 297–299, 1985; Z. Ivanov, T. Claeson, and T. Anderson, "Three terminal Josephson junction with a semiconductor accumulation layer," in Proc. 18th Int. Conf. on Low Temperature Physics (Kyoto); Jpn. J. Appl. Phys., Vo.. 26, pp. 1617–1618, 1987; H. Takayangi and T. Kawakami, "Superconducting proximity effect in the native inversion layer on InAs," Phys. Rev. Lett., Vol. 55, pp. 2449–2452, June 3, 1985. All these proposed devices function by changing the carrier density in the region under the gate, and thus the critical current in accordance with the equation given above for $\xi n$. Actual reductions to practice have been made for structures using silicon, InAs or GaAs as the semiconductor portion of the device.

FIG. 2 represents the source-drain current-voltage (I-V) characteristics of a typical three-terminal superconducting FET. The inverse slope of the characteristics in the voltage state is the normal resistance $R_N$ of the device. The critical current $I_C$ is the maximum zero-voltage (Josephson) current which can flow between source and drain of the device. If the bias current $I_b$ is less than $I_C$, then the voltage between source and drain is exactly zero. In a three-terminal superconducting FET, $I_C$ is controlled by the voltage applied to the gate electrode.

FIG. 3 is a schematic diagram of a typical superconductive FET inverter assuming the device works in the enhancement mode. As shown, the truth table for the device gate is:

| Vin | Vout |
|---|---|
| 0 | $V_{dd}$ (>$V_{crit}$) |
| $V_{dd}$ (>$V_{crit}$) | $I_d R_n$ |

This circuit can be used in a string of logic gates (shown in phantom) only if $I_d R_N > V_{crit}$, that is, if the product of the bias current and normal resistance of the weak link is greater than $V_{crit}$, the voltage required to induce a zero-voltage output in the following device. However, for all demonstrated devices in the prior art, $I_b R_N$ is significantly less than $V_{crit}$. This is why superconducting FETs of the prior art have been considered impractical.

In the circuit of FIG. 3, the bias current $I_b$ must be less than the maximum possible critical current $I_C$ in order to ensure that the device operates in the zero-voltage state. Therefore, a more general requirement for superconducting FETs is that $I_C R_N > V_{crit}$. For all known SFETs it has been observed that the $I_C R_N$ product is significantly less than the required critical gate voltage of a subsequent device. Some studies have suggested that possible improvements to this situation might be obtained by fabricating superconductive FETs with high temperature superconductive elements. See for example, A. W. Kleinsasser and T. N. Jackson, "Prospects for proximity effect superconducting FETs," IEEE Trans. Magn., vol. MAG-25, pp. 1274–1277, 1989. These researchers conclude that a higher $I_C R_N$ product might make possible the fabrication of devices with gain, but that such conclusion rests upon optimistic assumptions regarding material parameters and theory. Furthermore, despite extensive research, a number of theoretical questions persist concerning the operation of high temperature superconductive FETs which may effect whether practical FETs can be fabricated even with assumed improvements achieved with high temperature superconductor materials.

SUMMARY OF THE INVENTION

In contrast to prior art attempts to produce superconducting FETs with gain or speculation regarding improvements which may be achievable using high temperature superconductors, the present invention provides a solution to the dilemma by utilizing existing low temperature superconductive FETs in conjunction with closely associated conventional low temperature CMOS circuits to form a hybrid circuit. The hybrid circuit can perform functions neither technology can achieve separately. The design of the present invention depends only on properties of established superconductive materials, but nevertheless is well suited to take advantage of improvements achieved in high temperature superconductive materials. That is, the circuits which are the subject of the present invention do not require improvements to existing SFET technology; however, such SFET improvements would enhance the utility of the present invention.

The present invention utilizes conventional CMOS FETs located near SFETs, preferably but not necessarily, on the same integrated circuit to provide the gating voltage for SFET pass transistor logic operation. Pass transistors according to the present invention can be utilized to implement any of the large variety of logic functions currently implemented with conventional pass transistors. In addition, the pass transistor of the present invention can be used in pass transistor applications which traditionally have not been commercially used due to inherent design limitations. For example, conventional FET devices have not been used for many pass transistor applications because of their high on-resistance which contributes to large RC delays for the signal being passed. With the present invention, SFET pass transistors can function nearly as ideal pass transistors. The circuits of the present invention also provide an elegant means to amplify the output voltage of the SFET or Josephson device to a level suitable for switching of conventional CMOS gates, making them useful in the whole field of combinatorial logic circuits.

The hybrid circuits of the present invention have particular application to a wide variety of digital and analog VLSI applications, including neural networks, digital interconnections including crossbar switch arrays, all types of pass transistor combinatorial logic circuits including selector and tally circuits, multiplexing and demultiplexing, barrel shifters, and fast static random access memories.

BRIEF DESCRIPTION OF THE DRAWINGS

A better understanding of the present invention can be obtained when the following detailed description of the preferred embodiment is read in conjunction with the following drawings, in which:

FIG. 4 is a schematic diagram of a portion of a hybrid superconducting-semiconducting circuit according to the present invention;

FIG. 5 is a schematic diagram of the input/output voltage characteristics of a room temperature conventional CMOS inverter;

FIG. 6 is a schematic diagram of the input/output voltage characteristics of a low temperature CMOS inverter;

FIG. 7 is a schematic diagram of a hybrid superconducting-semiconducting circuit according to the present invention, which can be employed to extend the utility of the present semiconductor-superconductor hybrid family of circuits by providing an automatic, one-time precise adjustment of the threshold voltages of all CMOS gates;

FIG. 8 is a schematic diagram of a superconducting-semiconducting selector circuit according to the present invention;

FIG. 9 is a schematic diagram of a superconducting-semiconducting three-input tally circuit according to the present invention; and FIG. 10 in a schematic diagram of a superconducting-semiconducting barrel shifter circuit according to the present invention.

DESCRIPTION OF THE PREFERRED EMBODIMENT

Figure 1:
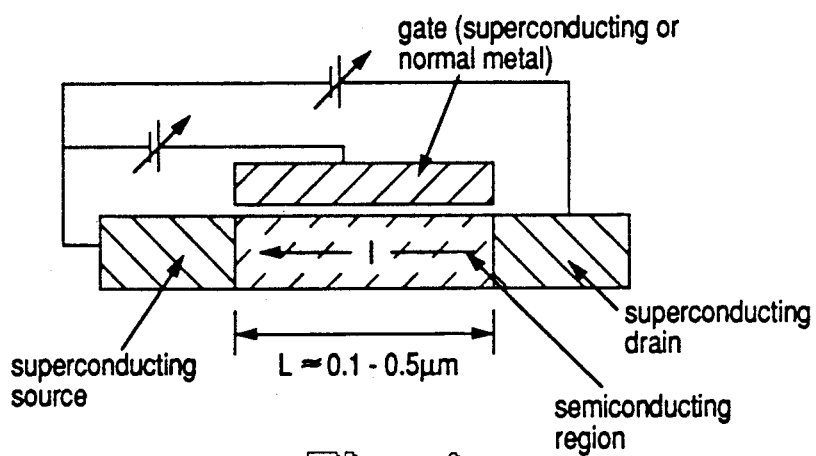
FIG. 1 is a schematic drawing of a field effect transistor manufactured with superconductive and semiconductive materials.
Figure 2:
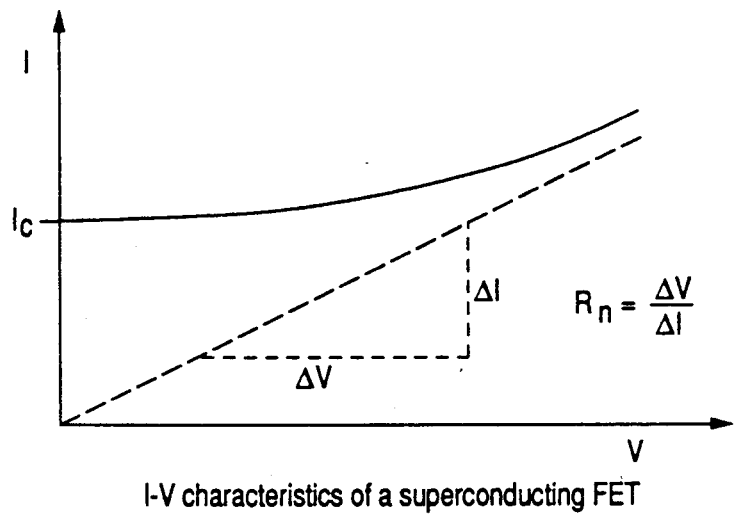
FIG. 2 is a source-drain current-voltage characteristics diagram for a typical superconducting FET.
Figure 3:
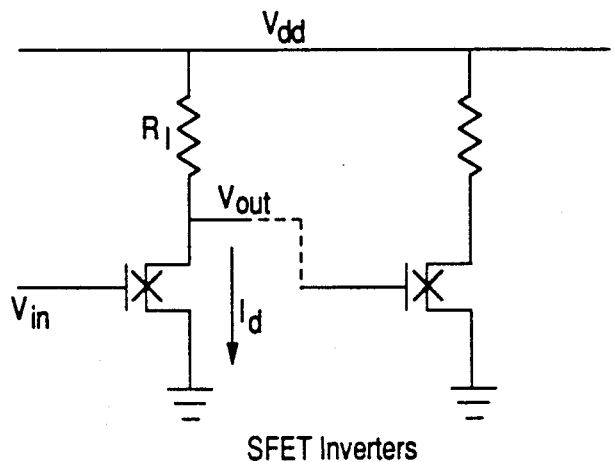
FIG. 3 is a simplified schematic diagram of a superconducting FET logic inverter.

The essence of the present invention is the utilization of enhancement mode CMOS devices such as a low temperature CMOS inverter correctly biased very close to its threshold as a low power, high gain amplifier to amplify the small voltages available from SFET devices and Josephson junctions to signal levels suitable for controlling other CMOS gates or SFETs. Known SFET devices can produce output signal levels on the order of millivolts. By combining the low temperature, preferably short channel (4.2 K.), CMOS circuitry of the present invention with low temperature SFETs it is possible to produce a hybrid circuit which functions as an ideal pass transistor, which can be in turn utilized to implement all forms of conventional pass transistor logic and memory devices with vastly improved speed and power consumption characteristics.

For large scale integration, one potential problem in using CMOS amplifiers to convert signal voltage levels of SFET and Josephson junctions to the voltage levels required to control other CMOS gates or SFETs has been that the uniformity of threshold voltages for mass produced CMOS inverters varies significantly, making the prospect of biasing large numbers of CMOS inverters close to their threshold a practical impossibility. The circuit of the present invention solves this problem by relying on the proven practically infinite charge holding time at a node isolated by CMOS pass transistors at low temperatures (less than 100 K.). The charge holding time at a node isolated by pass transistors is inversely proportional to the leakage current through the p-n junction's source and drain. The leakage current is in turn proportional to the intrinsic carrier density which decreases exponentially to zero for temperatures less than 100 K. If 0.5 volts is stored in a 5fF MOS capacitor under these conditions, the stored voltage will decay at a rate of approximately 1 millivolt per year at 77 K., and 1 nanovolt per year at 4 K.

The preferred embodiment of the present invention utilizes a conventional CMOS inverter/amplifier operating at low temperature (4.2 K.) and biased very closely to its threshold input voltage $V_T$. FIG. 4 is a simplified schematic diagram of such a device, comprised essentially of a pair of opposite polarity MOSFETs. At room temperature the input/output voltage transfer characteristics of such a device are illustrated schematically in FIG. 5. At input voltages $V_i$ less than the device threshold voltage $V_T$, output voltage $V_O$ is set at a high logic level, typically greater than 3 volts. As the input voltage increases past the threshold range, at best 30 millivolts, the output voltage $V_O$ decreases to a logic low level, typically the zero voltage level.

It is important to note that the typical transition voltage zone at room temperature is significantly greater than the typical maximum output voltage obtainable with SFETs. Consequently, a CMOS inverter at room temperature having an input voltage bias set at the low end of the transition zone could not be modulated between logic high and low states by the output stage of an SFET gate.

If the CMOS inverter is operating in the enhancement mode at low temperatures, however, the input/output voltage characteristic has been demonstrated to be much more ideal, transitioning from high to low output levels over a very narrow threshold voltage range (FIG. 6). At 4 K. a CMOS inverter demonstrates a transition range of approximately only 2 millivolts. The present invention takes advantage of this characteristic by utilizing a low temperature CMOS inverter biased very close to the input threshold voltage by a unique one-time biasing circuit described below to provide a large scale output voltage gain modulated by the relatively small output voltage of an associated SFET. The details of this circuit are illustrated in FIG. 7.

At very low temperatures, subthreshold characteristics of conventional CMOS are similar to that of short-channel silicon-on-insulator MOSFETs. At 4 K. the impurity dopants in the substrate freeze-out and the substrate thus acts like an insulator. Because of the ionization current from the drain, there is a positive feedback mechanism during turn-on and this leads to sharp threshold characteristics for large drain biases. Current increases amounting to seven orders of magnitudes have been observed for gate voltage increments of only 2 millivolts. This phenomenon is exploited in the present invention to generate extremely sensitive amplifiers. The positive feedback mechanism is usually associated with hysteresis in the drain to source voltage-current characteristics. This hysteresis is not a major concern in the present invention, since the transistors in a self-timed circuit are designed to be reset to their original state after calibration.

In the preferred embodiment of the present invention, submicron CMOS circuit elements operating at low temperatures (4.2 K.) provide a particularly elegant means to convert small SFET or JJ device output voltages to large CMOS switching level signals. The design of the circuit is extremely efficient and the area consumption for the self-calibration circuit is very small. These characteristics make the present invention uniquely suited for VLSI circuits where low power dissipation, small area and high speed operation are essential.

Referring now to FIG. 7, the preferred embodiment of a self-biasing, self-calibrating cryo-CMOS amplifier A used in the present invention is disclosed. Amplifier A includes a CMOS inverter/amplifier 10 and associated biasing circuit elements at cryogenic low temperature (i.e. less than room temperature). Each of the circuit elements of circuit A is fabricated in a conventional manner using short channel semiconductor integrated circuit techniques known in the art.

After the amplifier 10 has achieved a steady state low temperature, the voltage at bias line 12 is raised to a high voltage and the calibrating clock circuit 14 is started. Initially, the superconducting SFET or Josephson junction device 16 is kept in the voltage state. Feedback transistor P1 is initially off and hence pass transistor P2 is turned on and off by the clock pulse signal from clock 14 via inverter 18, P2 being on when the clock signal is low and off when the clock signal is high. The gate capacitance 20 is therefore charged incrementally by the voltage pulses provided in the drain circuit of transistor P2.

This charging takes place in small increments because P2 is selected to provide small drain-to-source current and designed so that it is not turned completely on by a single clock pulse applied to its gate. For example, the magnitude of the calibrating clock pulse can be sufficiently small to assure that each clock pulse will change the voltage of the inverter by less than 0.1 mV. This will allow charging the input gate of the amplifier to within 0.1 mV from the transition zone. The clock frequency and duty time can be adjusted to achieve the desired charging times.

When the gate voltage of amplifier 10 crosses the inverter threshold, pass transistor P1 is turned on and P2 is turned off. Once P2 is turned off bias line 12 is isolated from the input to amplifier 10. Thereafter, SFET or JJ 16 is reset to a zero-voltage state and the calibration cycle is complete. Resetting the SFET or JJ insures that the final quiescent voltage applied to the gate is about 3 mV from the transition zone if the circuit uses niobium as the superconducting material.

Amplifier 10 is therefore biased just at the edge or the lower end of the transition zone, and the charge on the input gate capacitance 20 is trapped for the entire life of the circuit. There is no need for recalibration unless the circuit is brought to room temperature. The self-calibration circuit needs only two input signals, the bias voltage and the clock signal which for the purposes of large scale integration can be provided from common lines to two different sources. If two SFETs or JJs fabricated using niobium as the superconductive material are connected in series, instead of the single JJ 30 at the input, then any change in the state of SFET 16 will cause amplifier 10 to make a complete transition from a high output voltage to a low output voltage. Furthermore, the self-calibration for all amplifiers 10 in large scale complex circuits could be done concurrently.

With the CMOS amplifier thus calibrated, input gate voltage provided from the output stage of SFET 16 to amplifier 10 will produce an output voltage $V_O$ which can modulate the input voltage of another CMOS device or SFET. The amplifier circuit can be used to convert low level signal output voltages from SFET pass transistors to high level voltages capable of controlling other SFET circuits. Such a circuit has numerous applications, some of which are described below.

COMBINATORIAL LOGIC APPLICATIONS

The general idea of using SFETs according to the present invention as ideal pass transistors can be extended to implement most types of combinatorial logic. Many applications exist where SFETs according to the present invention can be employed as bilateral circuit elements (i.e., a device which permits flow of information/logic signals in either direction, when the SFET gate voltage is high). While this property of SFETs according to the present invention is not necessarily of fundamental importance in circuit design, it is an interesting and occasionally useful one. Early relay switching logic used switch contacts that were bilateral elements. Additional information on relay-switching logic can be found, for instance, in S. H. Caldwell, "Switching Circuits and Logical Design", New York: Wiley (1958); Z. Kohavi, "Switching and Finite Autonomata Theory", New York: McGraw-Hill (1970); and C. Mead and L. Conway, "Introduction to VLSI Systems", Addison-Wesley Publishing Company (1980).

All the generic types of pass transistor combinatorial circuits can be implemented in terms of the SFETs embedded in hybrid superconductor-semiconductor circuits. These include programmable logic arrays, selector circuits and tally circuits—circuits in terms of which all finite-state machines can be built. The last two types of circuits have not been popular in all VLSI designs because these circuits cannot be extended to large complexities in semiconductor FET logic. The RC delay through N semiconductor FET pass transistors grows proportional to $N^2$ and the circuit delay becomes intolerably large for small values of N. It becomes necessary to insert level restoration circuits and buffers before extending these to larger complexities.

FIG. 8 illustrates a simple embodiment of an SFET selector circuit in which one of the inputs $S_0$, $S_1$, $S_2$, $S_3$ is selected for the output by the control variables A and B according to the function:

$$Z = S_0 A'B' + S_1 A'B + S_2 AB' + S_3 AB.$$

For each possible combination of values of A and B there is a path trough the selector to the output from only one of the inputs $S_i$. As before, the currents in the data path are smaller than the critical current of the SFETs and the gate voltages are provided by a semiconductor circuitry. Note that the entire circuit is functionally bilateral, i.e. a data signal at the output can be directed to only one of the inputs for a particular combination of values of A and B. Also note that the circuit does not dissipate any static power and the area of this SFET implementation can be extremely small. The data path is not effected by RC delays and there is no need for a level restoration circuit or buffers when the selector circuit is extended to cover more inputs. Generalizations of such circuits could be used for multiplexing and demultiplexing.

As an example of a more complex combinatorial logic circuit, consider the SFET implementation of a three input tally function illustrated in FIG. 9. A tally circuit has in general, N inputs and N+1 outputs. The kth output is to be high and all others low if k of the inputs are high. The Boolean equations for the outputs $Z_i$ representing this function in terms of three inputs $X_i$ are:

$$Z_0 = X'_1 X'_2 X'_3$$

$$Z_1 = X_1 X'_2 X'_3 + X'_1 X_2 X'_3 + X'_1 X'_2 X_3$$

$$Z_2 = X_1 X_2 X'_3 + X_1 X'_2 X_3 + X'_1 X_2 X_3$$

$$Z_3 = X_1 X_2 X_3$$

If such a circuit were designed with random logic consisting of conventional FET or Josephson junction gates, it would result in a topological kludge, especially for the case when the number of inputs is large. The SFET implementation, on the other hand, is very regular and compact. The inherent superiority of SFETs in implementing combinatorial circuits is thus apparent from these examples.

A circuit that is included in the data path of most microprocessors is the barrel shifter. This type of circuit allows the contents of the data path to be shifted or rotated. Typically semiconductor FET pass transistor versions are slow and are limited by RC delays and the loss of signal magnitude. An SFET implementation of such a circuit is shown in FIG. 10. The currents in the data path are smaller than the critical current of the SFETs and the gate voltages are provided by a semiconductor circuitry. The control lines $S_i$ can be used to shift or rotate data from the bus lines $B_i$ into data lines $D_i$. The lines $D_i$ can also be used to insert data that is part of the data path control instruction (literals) into the data stream. The SFET versions of barrel shifters can be extremely fast even for large numbers of buses.

It should be noted that the static power consumption in all the above SFETs implementations is zero. Hence, SFETs also form the most efficient way of converting voltage signals in the semiconductor circuitry to current signals in the superconductor circuit.

The present invention, therefore, is well adapted to carry out the objects and attain the ends and advantages mentioned as well as others inherent therein. While presently preferred embodiments of the invention have been given for the purpose of disclosure, numerous changes in the details of construction and steps of the process will be readily apparent to those skilled in the art and which are encompassed within the spirit of the invention and the scope of the appended claims.

What is claimed is:

1. A superconducting-semiconducting electrical circuit element comprising:
   (a) a superconducting charge controlled three-terminal device, having a device control terminal, a second terminal and a third terminal, wherein the output current between the second and third terminals is controlled by the voltage applied to the control terminal, and wherein the output current exhibits superconducting characteristics as a function of temperature and input charge conditions; and
   (b) a cryogenic semiconducting interconnect circuit, adapted to receive as an input an output signal from said superconducting device, and to provide a semiconductor switching voltage level output signal modulated by the input signal from said superconducting device.

2. The circuit element of claim 1, wherein said superconducting charge controlled device comprises a superconducting field-effect transistor having a superconducting source, a superconducting drain, a conducting gate, and a semiconducting channel, and wherein the drain to source current is controlled by the applied gate to source voltage.

3. The circuit element of claim 1, wherein said cryogenic semiconducting interconnect circuit comprises a semiconductor inverter circuit.

4. The circuit element of claim 3, wherein said semiconductor inverter circuit further comprises a biasing means for biasing said inverter to a voltage level slightly less than the input voltage threshold of said inverter at the edge of the transition zone of the voltage transfer characteristic.

5. The circuit element of claim 4, wherein said biasing means further comprises:
   a bias voltage source; and
   calibration means for incrementally applying bias voltage to said inverter from said bias voltage source.

6. The circuit element of claim 5, wherein said calibration means further comprises a bias voltage disabling means for terminating the incremental biasing of said inverter at the edge of the transition zone of the voltage transfer characteristic.

7. The circuit element of claim 4, wherein said biasing means further comprises means for maintaining the bias voltage applied to the input of said inverter.

8. The circuit element of claim 4, wherein said inverter is of the type having an input capacitance, and wherein said biasing means comprises means for charging the input capacitance to a voltage level slightly less than the transition zone of the voltage transfer characteristic.

9. The circuit element of claim 8, wherein said calibration means comprises:
   a. a voltage source for providing a periodic pulse voltage output signal; and
   b. a semiconductor, three-terminal switching element having an input gate terminal, a voltage supply terminal, and an output terminal, wherein said gate terminal is provided the periodic pulse voltage signal as an input gate control signal, said voltage supply terminal is connected to said bias voltage means, and said output terminal is connected to the input of said semiconductor inverter circuit.

10. The circuit element of claim 9, wherein said three-terminal switching element comprises a semiconductor field effect transistor.

11. The circuit element of claim 6, wherein said bias voltage disabling means comprises a three-terminal switching element, having an input gate terminal, an output terminal and a disabling voltage terminal, and wherein said gate terminal receives the output voltage signal from said inverter as an input gate control signal, said disabling voltage terminal is held at a disabling voltage level, and said output terminal is provided as a biasing voltage disabling signal to terminate the incremental biasing of said inverter in response to a change in state of the output voltage from said inverter.

12. The circuit element of claim 11, wherein said bias voltage disabling means comprises a semiconductor field effect transistor.

13. The circuit element of claim 7, wherein said means for maintaining the bias voltage on said inverter comprises a cryogenic semiconductor three-terminal switching element, comprised of alternatively doped semiconductor elements, said three-terminal switching element having an input gate terminal, a voltage supply terminal, and an output terminal, wherein said gate terminal is provided with a bias enabling signal, said voltage supply terminal is connected to said bias voltage source, and said output terminal is connected to the input of said semiconductor inverter circuit.

14. The circuit element of claim 1, wherein said superconducting charge controlled device comprises a Josephson Junction device.

15. The circuit element of claim 2, wherein said superconducting field-effect transistor has a superconducting gate.

16. A superconducting-semiconducting electrical circuit element comprising:
(a) a superconducting charge controlled three-terminal device, having a device control terminal, a second terminal and a third terminal, wherein the output current between the second and third terminals is controlled by the voltage applied to the control terminal, and wherein the output current exhibits superconducting characteristics as a function of temperature and input charge conditions; and
(b) a voltage transducer adapted to receive as an input signal a signal formed in the output stage of said superconducting charge controlled device, and for providing a semiconductor switching level voltage output signal in response to changes in state of the output signal from said superconducting charge controlled device.

17. The circuit element of claim 1, wherein said superconducting charge controlled element and said cryogenic semiconducting circuit are fabricated in a monolithic integrated circuit.

18. A digital selector network formed of a plurality of superconducting-semiconducting electrical circuit elements, each of said elements comprising:
(a) a superconducting charge controlled three-terminal device, having a device control terminal, a second terminal and a third terminal, wherein the output current between the second and third terminals is controlled by the voltage applied to the control terminal, and wherein the output current exhibits superconducting characteristics as a function of temperature and input charge conditions; and
(b) a cryogenic semiconducting interconnect circuit, adapted to receive as an input an output signal from said superconducting device, and to provide a semiconductor switching voltage level output signal modulated by the input signal from said superconducting device.

19. The digital selector network of claim 18, wherein:
the control terminals of said plurality of circuit elements are selectively coupled to a series of logic control signals designated A, A', B, B';
the second terminals of said plurality of circuit elements are selectively coupled to a series of input signals $S_0$, $S_1$, $S_2$, $S_3$; and
the third terminals of said plurality of circuit elements are coupled to a common output terminal having a value designated as the variable Z, so as to satisfy the following logic function:

$$Z = S_0 A'B' + S_1 A'B + S_2 AB' + S_3 AB.$$

20. A digital barrel shifter circuit of the type adapted to permit the rotation or shifting of the contents of data present on a plurality of bus lines $B_i$ into data lines $D_i$ under control of a plurality of control signals $S_i$, said shifter circuit being comprised of a plurality of superconductor-semiconductor electrical circuit elements, each of said circuit elements comprising:
(a) a superconducting charge controlled three-terminal device, having a device control terminal, a second terminal and a third terminal, wherein the output current between the second and third terminals is controlled by the voltage applied to the control terminal, and wherein the output current exhibits superconducting characteristics as a function of temperature and input charge conditions; and
(b) a cryogenic semiconducting interconnect circuit, adapted to receive as an input an output signal from said superconducting device, and to provide a semiconductor switching voltage level output signal modulated by the input signal from said superconducting device; and
(c) wherein said control terminals of said circuit elements are selectively coupled to said control signals $S_i$, said second terminals of said circuit elements are selectively coupled to said bus lines $B_i$, and said third terminals of said circuit elements are selectively coupled to said data lines $D_i$.

* * * * *